United States Patent
Wong et al.

(10) Patent No.: US 6,208,169 B1
(45) Date of Patent: Mar. 27, 2001

(54) INTERNAL CLOCK JITTER DETECTOR

(75) Inventors: Keng L. Wong; Gregory F. Taylor, both of Portland; Ravishankar Kuppuswamy, Hillsboro; Douglas R. Parker, Forest Grove; Hung-Piao Ma, Portland; Kent R. Callahan, Hillsboro, all of OR (US); Xia Dai, Chavez Way, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/340,975

(22) Filed: Jun. 28, 1999

(51) Int. Cl.[7] ................................................ H03K 19/096
(52) U.S. Cl. ............................................... 326/93; 327/175
(58) Field of Search ................................ 326/93; 327/175

(56) References Cited

U.S. PATENT DOCUMENTS 5,764,091 * 6/1998 Sumita et al. ...................... 327/175

* cited by examiner

*Primary Examiner*—Daivd Nelms
*Assistant Examiner*—M. Tran
(74) *Attorney, Agent, or Firm*—Blakely, Sokoloff, Taylor & Zafman LLP

(57) ABSTRACT

An apparatus and method for detecting and measuring internal clock jitter is disclosed. In one embodiment, a reference clock generator generates a reference clock signal based on an instantaneous clock signal. The reference clock signal includes the instantaneous clock signal delayed for an average duration. A phase comparing element receives both the instantaneous clock signal and the reference clock signal such that the phase comparing element measures a phase difference between the instantaneous clock signal and the reference clock signal. The magnitude and direction of the phase difference is indicated by one of a number of distinct phase difference bins in the phase comparing element.

30 Claims, 8 Drawing Sheets

INTERNAL CLOCK JITTER DETECTOR

BACKGROUND OF THE INVENTION

1. Field of the Invention

The present invention relates generally to microprocessor circuits, and more specifically to internal clocks in microprocessor circuits.

2. Background Information

The instability of the internal clock of a microprocessor can cause numerous problems. For example, uncertainty in the ideal period duration can result in temporal clock cycle shrink which limits critical paths. Furthermore, uncertainty in phase time can affect half-cycle paths. As the speeds of microprocessors increase, these types of problems take on greater significance.

These problems are attributable to clock jitter, which is caused and exacerbated by various factors. For example, the internal clock in a microprocessor is inherently subject to variation caused by power supply noise modulating the delay of the clock distribution network. The systematic accumulated/response error from the PLL/clock generator further increases the uncertainty of the clock edge.

As the internal clock period and high/low times are distorted, a reduction occurs in the time available for critical paths in some clock cycles or half-cycles; this reduction causes a reduction in the maximum operating frequency of the circuit. Measurement of on-chip jitter is hampered by flip-chip packages that are difficult to probe. Clock jitter can be driven off chip via buffers, but the buffers are also subject to the same delay variations that cause the clock jitter. Because on-chip jitter is purely internal to a chip and chips are becoming more complex, this type of jitter is becoming more difficult to observe accurately with existing devices and techniques.

Thus, what is desired is an apparatus and method for detecting and measuring internal clock jitter.

SUMMARY OF THE INVENTION

An apparatus and method for detecting and measuring internal clock jitter is disclosed. In one embodiment of the present invention, a reference clock generator receives a clock signal to generate a reference clock signal. The reference clock signal includes the clock signal delayed for an average duration. A phase comparing element receives both the clock signal and the reference clock signal such that the phase comparing element measures a phase difference between the clock signal and the reference clock signal. The magnitude and direction of the phase difference is indicated by one of a number of distinct phase difference bins in the phase comparing element.

Additional features and benefits of the present invention will become apparent from the detailed description, figures and claims set forth below.

BRIEF DESCRIPTION OF THE DRAWINGS

Various embodiments of the present invention will be described in detail with reference to the following drawings in which like reference numerals refer to like elements. The present invention is illustrated by way of example and not limitation in the accompanying figures.

DETAILED DESCRIPTION

An apparatus and method for detecting and measuring internal clock jitter is disclosed. The following description provides embodiments of the present invention. However, it will be appreciated that other embodiments of the present invention will become apparent to those of ordinary skill in the art upon examination of this description. Thus, the present description and accompanying drawings are for purposes of illustration and are not to be used to construe the invention in a restrictive manner.

In one embodiment of the present invention, a reference clock generator receives a clock signal and generates a reference clock signal based on the clock signal. The reference clock signal includes the clock signal delayed for an average duration. A phase comparing element receives and compares the clock signal and the reference clock signal. A phase difference between the clock signal and the reference clock signal is indicated in one of a number of phase difference bins. Each phase difference bin corresponds to a unique range of jitter. The contents of the phase difference bins are post-processed to provide an account of the jitter detection and measurement. As will be described in more detail below, the present invention has numerous applications such as the detection and measurement of full period jitter, low phase jitter and high phase jitter.

Figure 1A:
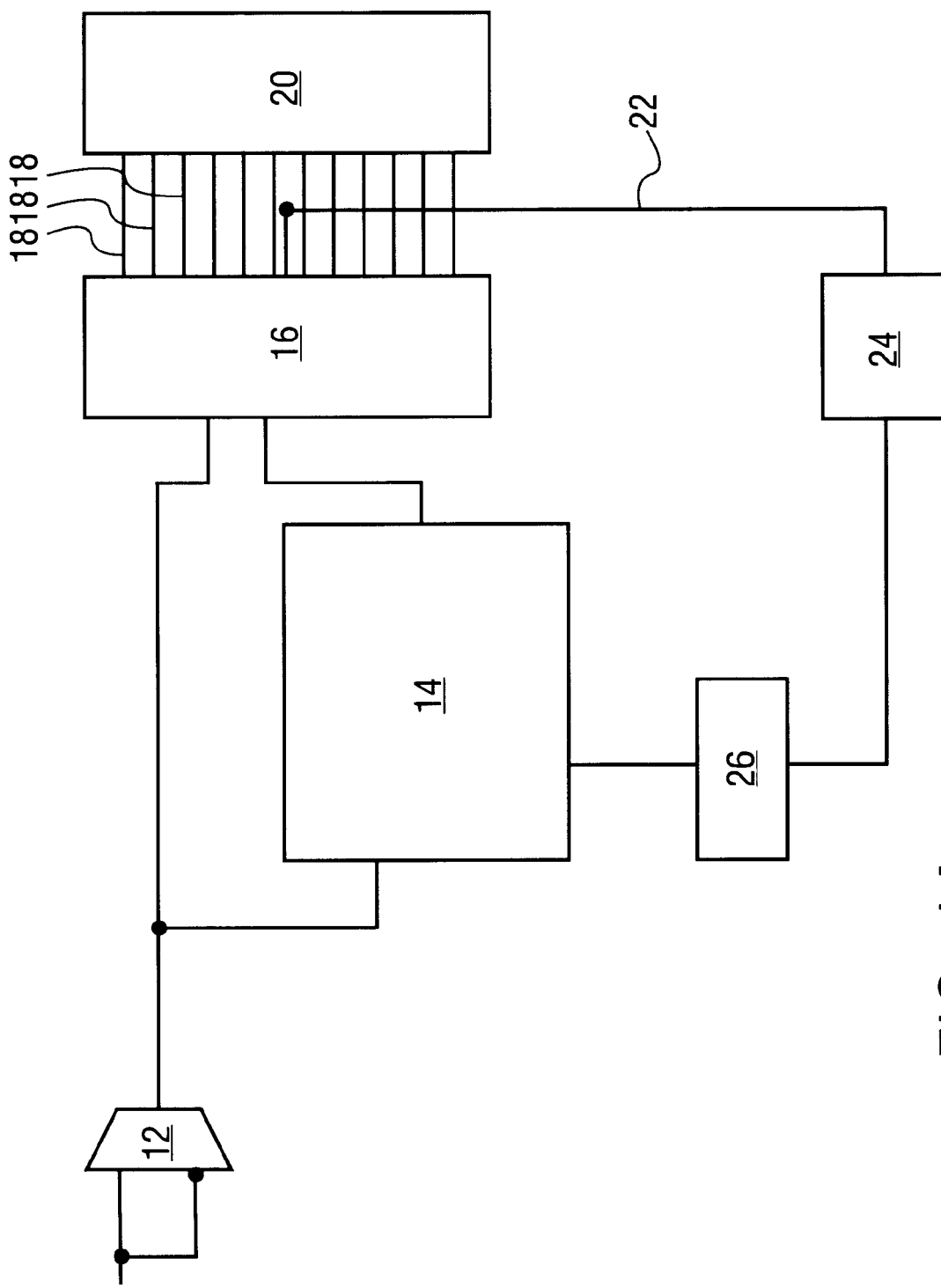
FIG. 1A is a block diagram of one embodiment of a jitter detector system in accordance with the teachings of the present invention.
Figure 1B:
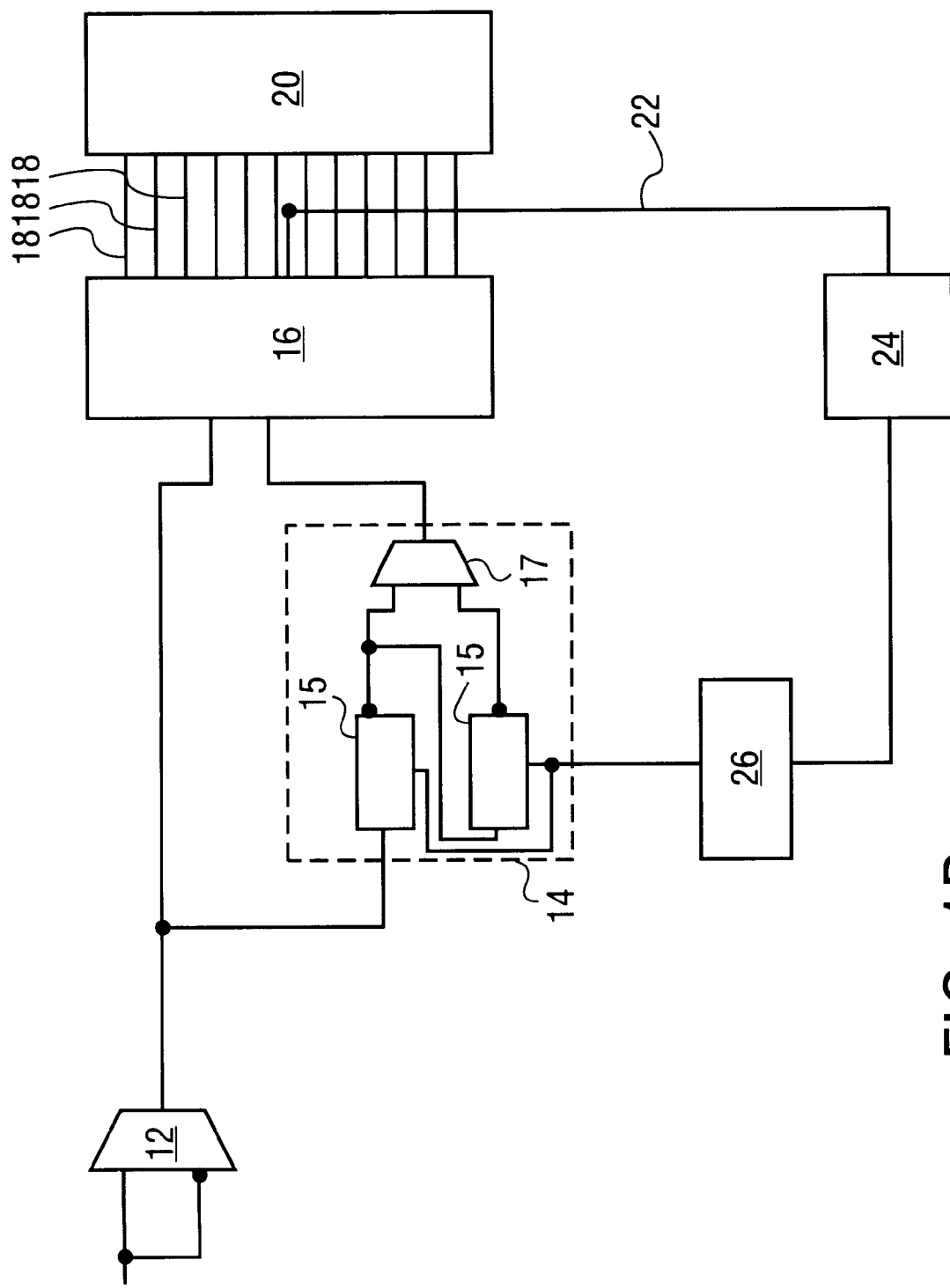
FIG. 1B is a block diagram of another embodiment of a jitter detector system in accordance with the teachings of the present invention.

FIGS. 1A and 1B show two embodiments of a jitter detector system in accordance with the teachings of the present invention. A clock signal is received by a multiplexor 12 which outputs the clock signal, in either an inverted or non-inverted form, to both a reference clock generator 14 and a phase comparing element 16. In one embodiment, reference clock generator 14 includes two inverting half-delay circuits 15 coupled to each other. Both inverting half-delay circuits 15 are coupled to a multiplexor 17 which provides the output of reference clock generator 14. Phase comparing element 16 receives a reference clock signal from reference clock generator 14. Phase comparing element 16 compares the clock signal to the reference clock signal and detects a phase difference between the two signals. The phase difference is indicated by phase difference bins (not shown), the outputs 18 of which are received by post-processing logic 20. A center output 22 of phase comparing element 16 is coupled to a low pass filter 24, which is coupled to a control word counter 26. Both half-delay circuits 15 are coupled to control word counter 26. Center output 22 communicates to low pass filter 24 the direction of shift between the clock signal and the reference clock signal. Low pass filter 24 serves to stabilize the half-delay circuit output over a wide time window and issues an increment/decrement command to control word counter 26, which interfaces to a delay-locked loop (DLL) and closes the control loop. In one embodiment, the DLL consists of inverting half-delay circuits 15, center output 22 from a center phase detector (not shown in FIGS. 1A and 1B) of phase comparing element 16, low pass filter 24, and control word counter 26 feeding back to half-delay circuits 15.

In another embodiment of the present invention, the jitter detector system is driven by the DLL core which, when locked, provides a stable reference of an average clock period. Reference clock generator 14 accordingly acts as a delay circuit. In one embodiment, the delay circuit is split into two halves by inverting half-delay circuits 15. Each inverting half-delay circuit 15 delays the clock signal by an average half-period. By using two inverting half-delay circuits 15, the system is flexible enough to provide for both full- or half-period comparisons. Thus, the embodiment shown in FIG. 1B can be used for low and high phase jitter detection and measurement. It should be noted that the low and high phase applications are based on the phase comparing element 16 being rising edge sensitive. It should be noted that the reference clock signal generated by reference clock generator 14 is the clock signal delayed for an average duration. It is appreciated that the system can be configured for a specific application. For example, rather than using two inverting half-delay circuits, a single noninverting full-delay circuit can be used. It should be noted that the delay circuits can be calibrated using commonly known methods.

Figure 2:
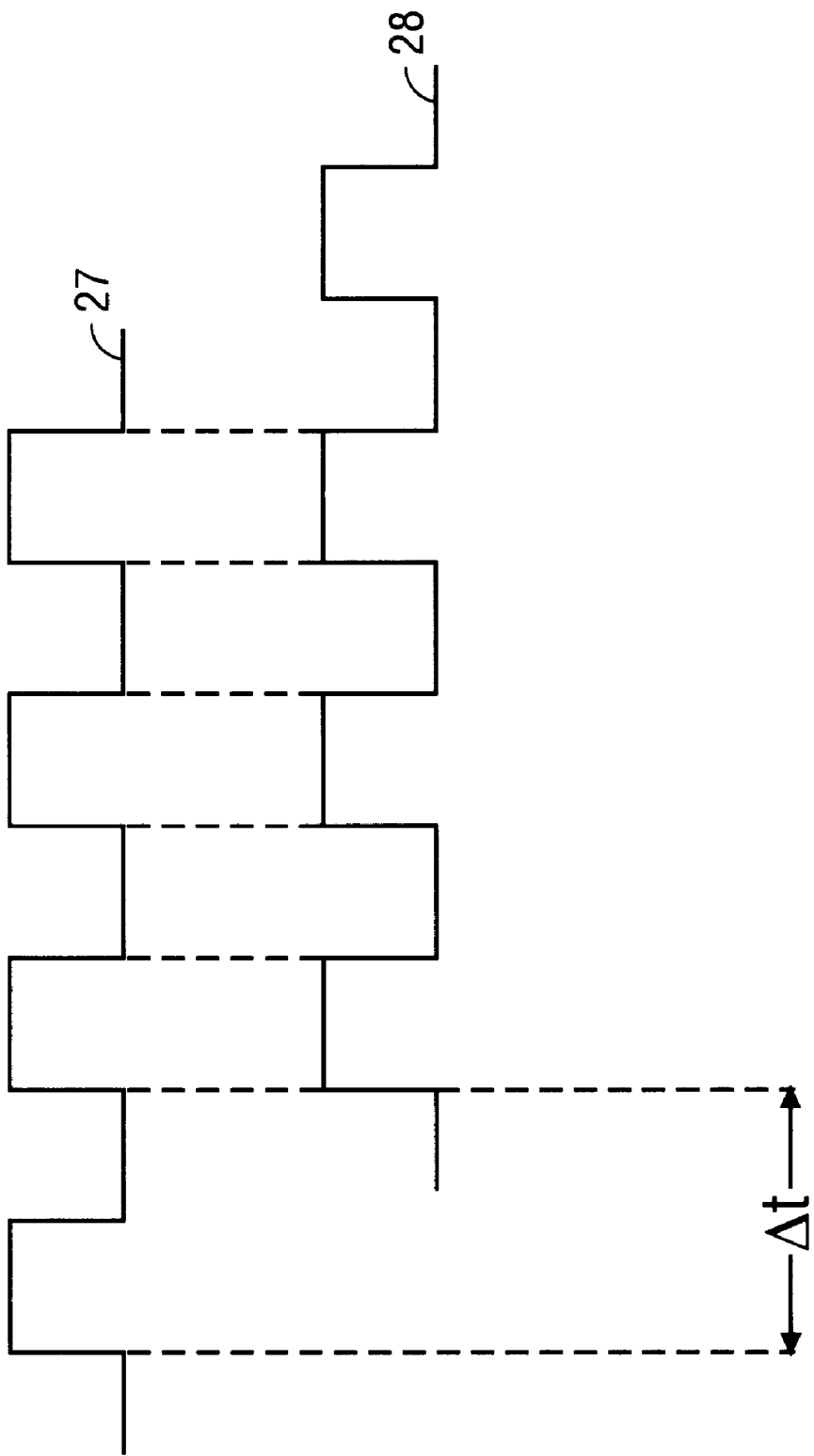
FIG. 2 is a timing diagram comparing two clock signals in accordance with the teachings of the present invention.

FIG. 2 is a timing diagram comparing a clock signal 27 to a reference clock signal 28 in accordance with the teachings of the present invention. Reference clock signal 28 is clock signal 27 delayed for an average period Δt. Jitter in clock signal 27 is indicated by a comparison between clock signal 27 and reference clock signal 28. For example, if jitter is present in clock signal 27, then the average period Δt which is used to form reference clock signal 28 will create a phase offset between corresponding edges of clock signal 27 and reference clock signal 28. If clock signal 27 is perfectly stable or jitter free, then the delay of the average period Δt will form a reference clock signal 28 that is shifted one period relative to clock signal 27. As shown in FIG. 2, clock signal 27 is stable (no jitter) and as a result, the corresponding edges of reference clock signal 28 and clock signal 27 line up without any phase offset between them.

Figure 3:
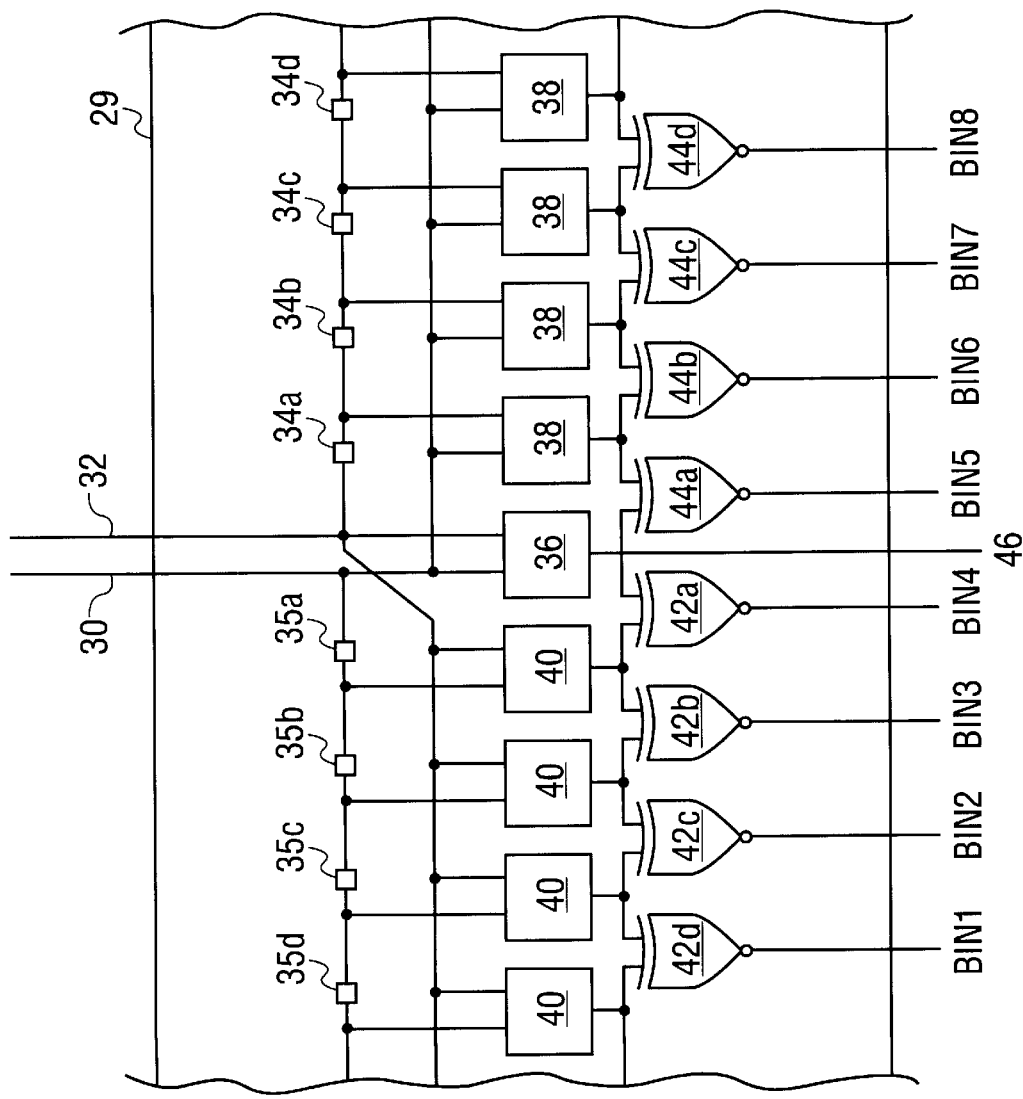
FIG. 3 is a block diagram of a phase comparing element used in a jitter detector system in accordance with the teachings of the present invention.

Once a reference clock signal is generated, it is received by a phase comparing element. In one embodiment, when the phase comparing element compares the clock signal to the reference clock signal, it is detecting jitter by comparing an instantaneous clock signal to the clock signal delayed for an average duration. FIG. 3 is a detailed block diagram of one embodiment of a phase comparing element in accordance with the teachings of the present invention. Phase comparing element 29 receives a reference clock signal via input 30 and a clock signal via input 32. Center flip-flop 36 receives the reference clock signal and clock signal directly from inputs 30 and 32, respectively. Center flip-flop 36 outputs a high or low depending on the relative phase relationship between the reference clock signal and the clock signal. Output 46 of center flip-flop 36 communicates the direction of shift to a low pass filter.

Delay elements 34a–34d receive the clock signal and progressively delay it before it passes to outer flip-flops 38. In one embodiment, delay elements 34a–34d have fixed delays. For example, delay element 34a applies a delay of 12.5 ps, delay element 34b applies a delay of 12.5 ps, delay element 34c applies a delay of 25 ps, and delay element 34d applies a delay of 25 ps. Outer flip-flops 38 then compare the delayed clock signal to the reference clock signal. Delay elements 35a–35d receive the reference clock signal and progressively delay it before it passes to outer flip-flops 40. In one embodiment, delay elements 35a–35d have fixed delays. In another embodiment, delay elements 35a–35d mirror delay elements 34a–34d. Thus, in relation to the example above, delay element 35a and 35b would apply a delay of 12.5 ps, and delay elements 35c and 35d would apply a delay of 25 ps. Outer flip-flops 40 then compare the delayed reference clock signal to the clock signal.

Outputs of adjacent flip-flops are compared by XOR logic 42a–42d and 44a–44d to give phase bin information. The outputs of XOR logic 42a–42d and 44a–44d indicate which bin has received a hit. An error condition occurs when more than one bin receives a hit based on one comparison of clock signals. In such a situation, the outputs are ignored for that sample. It should be noted that the phase bins provide a range of measurement for detected jitter of the clock signal relative to the reference clock signal. The amount of delay of each delay element can be varied to provide fine bins and coarse bins, as shown in Table 1.

TABLE 1

Sample Phase Difference Bins in Fine Range and Coarse Range

Figure 4:
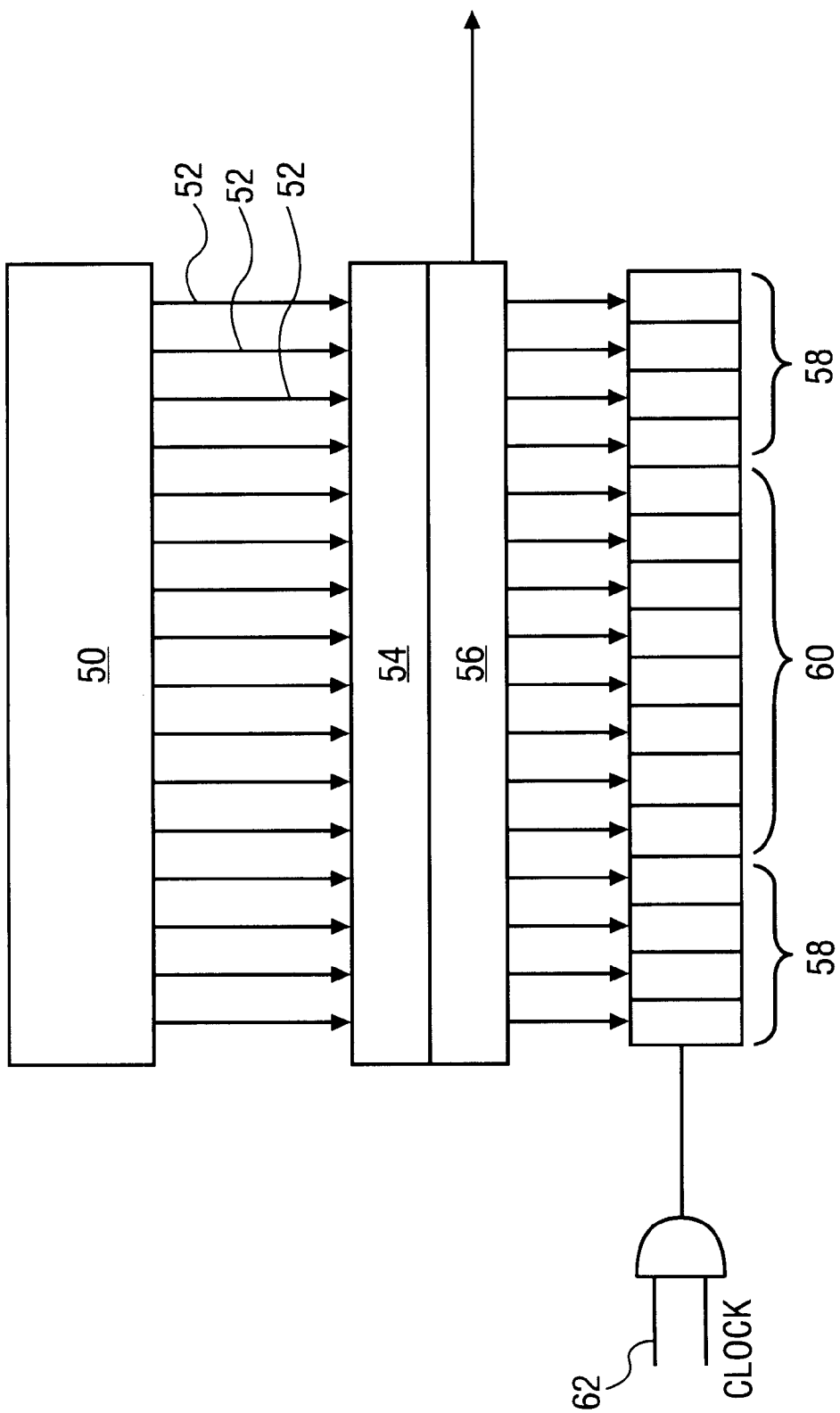
FIG. 4 is a block diagram showing the post-processing logic used to view detected jitter in histogram mode.

| Bin | Fine Range | Coarse Range |
| --- | --- | --- |
| 0 | beyond −75 ps | beyond −150 ps |
| 1 | −50 ps to −75 ps | −100 ps to −150 ps |
| 2 | −25 ps to −50 ps | −50 ps to −100 ps |
| 3 | −12.5 ps to −25 ps | −25 ps to −50 ps |
| 4 | 0 ps to −12.5 ps | 0 ps to −25 ps |
| 5 | 0 ps to +12.5 ps | 0 ps to +25 ps |
| 6 | +12.5 ps to +25 ps | +25 ps to +50 ps |
| 7 | +25 ps to +50 ps | +50 ps to +100 ps |
| 8 | +50 ps to +75 ps | +100 ps to +150 ps |
| 9 | beyond +75 ps | beyond +150 ps | bins provide more accurate measurements than coarse bins, but coarse bins are less likely to generate an error condition. Furthermore, the number of bins can be varied by varying the number of flip-flops in the phase comparing element.

once phase bin information is acquired, the data can be post-processed to provide a visual record of the data. FIG. 4 is a block diagram of one embodiment of post-processing logic that can be used to view phase bin information in histogram mode. Phase comparing element 50 provides phase difference bins (not shown), the outputs 52 of which are sent to XOR logic 54, which is coupled to error detection logic 56. Error detection logic 56 raises an error flag when more than one phase bin is detected active for one sample. When an error flag is raised, the corresponding sample is ignored. The data capture window is controlled by an external trigger signal 62, thereby providing means to isolate observed jitter in time. Counters are used in histogram mode. In one embodiment, both 4-bit counters 58 and 8-bit counters 60 are used. The 4-bit counters 58 can store 15 hits, while the 8-bit counters 60 can store 255 hits. A counter increments on detecting a valid bin hit from an associated bin. It should be noted that the 8-bit counters 60 are located to store hits from the most commonly active bins.

Figure 5:
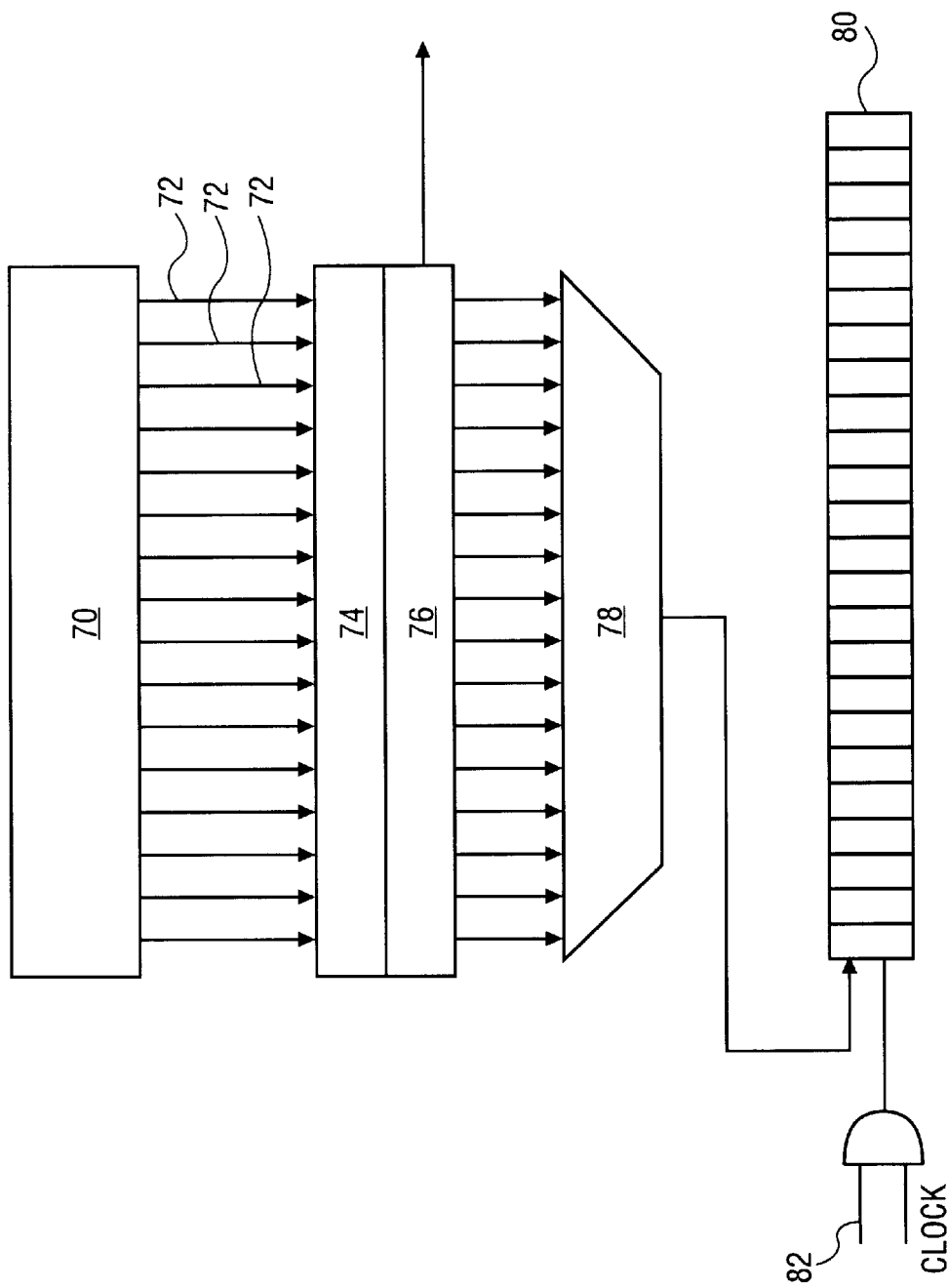
FIG. 5 is a block diagram showing the post-processing logic used to view detected jitter in graph mode.

FIG. 5 is a block diagram of one embodiment of post-processing logic that can be used to view phase bin information in graph mode. Phase comparing element 70 provides phase difference bins (not shown), the outputs 72 of which are sent to XOR logic 74, which is coupled to error detection logic 76. Error detection logic 76 raises an error flag when more than one phase bin is detected active for one sample. The data capture window is controlled by an external trigger signal 82. Registers are used in graph mode. In one embodiment, a 24-deep, 4-wide set of shift registers 80 is used. The phase bin information is first encoded by encoder 78 into a compact 4-bit format, and then it is pushed into registers 80 in a first-in-first-out (FIFO) manner. By shifting the content of one register into the next, a graphical wave form of the detected jitter over the last 24 cycles is stored. To preserve the timing progression of the graph, a sample is not ignored when an error flag is raised. Instead of ignoring the sample, the output of encoder 78 is set to (1111). If the error flag is raised, then all (1111) data points should be considered invalid.

Figure 6:
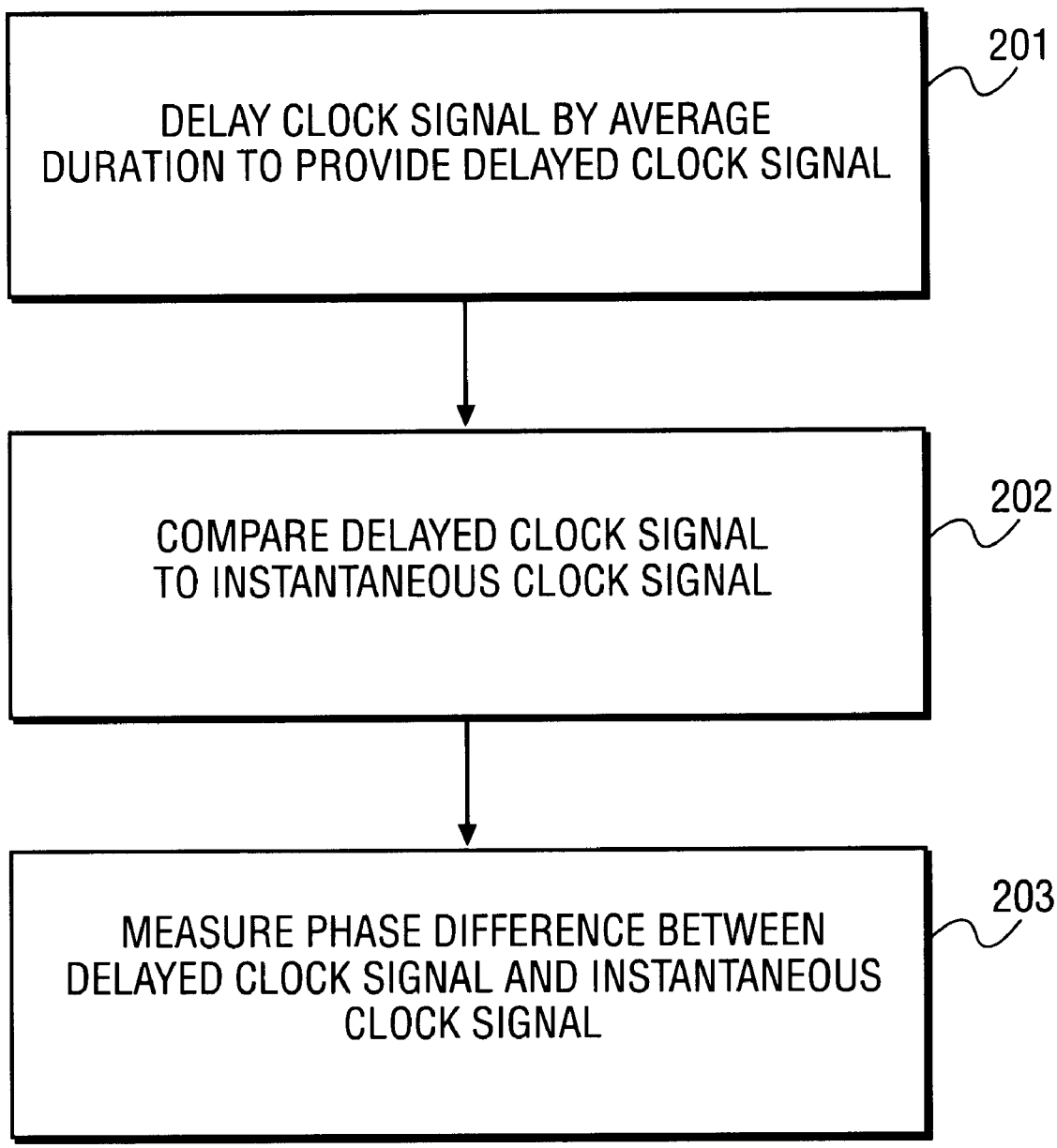
FIG. 6 is a flowchart showing steps performed in accordance with the teachings of the present invention.

FIG. 6 is a flowchart showing steps performed in accordance with the teachings of the present invention. In step 201, a clock signal is delayed by a delay line average duration to provide a delayed clock signal. In step 202, the delayed clock signal is compared to an instantaneous clock signal. In step 203, the phase difference between the delayed clock signal and the instantaneous clock signal is measured.

Figure 7:
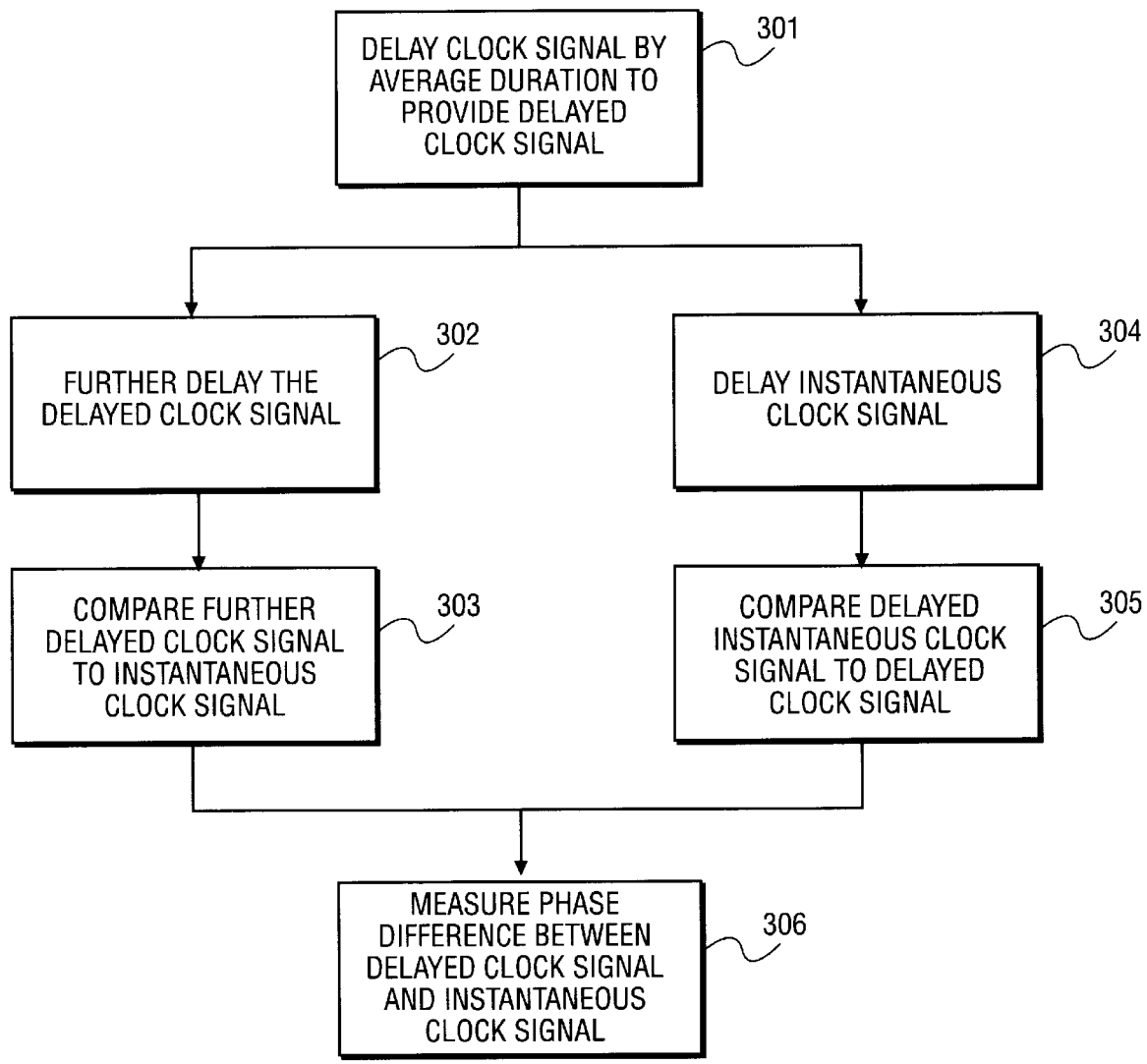
FIG. 7 is a flowchart showing additional steps performed in accordance with the teachings of the present invention.

FIG. 7 is a flowchart showing additional steps performed in accordance with the teachings of the present invention. In step 301, a clock signal is delayed by a delay line average duration to provide a delayed clock signal. In step 302, the delayed clock signal is further delayed by a phase bin delay. In one embodiment, the phase bin delay is fixed. In step 303, the further delayed clock signal is compared to an instantaneous clock signal. In step 304, the instantaneous clock signal is delayed by a phase bin delay. In step 305, the delayed instantaneous clock signal is compared to the delayed clock signal. In step 306, a phase difference between the delayed clock signal and the instantaneous clock signal is measured. It should be noted that steps 302–303 can be performed concurrently with steps 304–305.

In the foregoing detailed description, the apparatus and method of the present invention have been described with reference to specific exemplary embodiments. However, it will be evident that various modifications and changes may be made without departing from the broader scope and spirit of the present invention. The present specification and figures are accordingly to be regarded as illustrative rather than restrictive.

What is claimed is:

1. A circuit comprising:
   a reference clock generator coupled to receive a clock signal to generate a reference clock signal; and
   a phase comparing element coupled to receive the clock signal and the reference clock signal, the phase comparing element to measure a phase difference between the clock signal and the reference clock signal.

2. The circuit of claim 1 wherein the reference clock signal comprises the clock signal delayed for an average duration.

3. The circuit of claim 2 wherein the average duration is an average period.

4. The circuit of claim 2 wherein the average duration is an average half-period.

5. The circuit of claim 2 wherein the phase comparing element further comprises a first delay element coupled to receive the clock signal and a second delay element coupled to receive the reference clock signal.

6. The circuit of claim 2 wherein the phase comparing element comprises a plurality of phase difference bins, each phase difference bin of the plurality of phase difference bins coupled to indicate at least one output from the plurality of flip-flops.

7. The circuit of claim 1 wherein the phase comparing element comprises a plurality of flip-flops coupled to receive the clock signal and the reference clock signal, a first flip-flop of the plurality of flip-flops directly coupled to receive the clock signal and the reference clock signal.

8. The circuit of claim 1 wherein the reference clock generator comprises a first half-delay circuit coupled to a second half-delay circuit, the first and second half-delay circuits coupled to a multiplexor providing an output of the reference clock generator.

9. A circuit comprising:
   a delay circuit coupled to receive a clock signal to generate a delayed clock signal; and
   a phase comparing element coupled to receive the clock signal and the delayed clock signal, the phase comparing element to measure a phase difference between the clock signal and the delayed clock signal.

10. The circuit of claim 9 wherein the phase comparing element comprises a plurality of flip-flops coupled to receive the clock signal and the delayed clock signal, a first flip-flop of the plurality of flip-flops directly coupled to receive the clock signal and the delayed clock signal.

11. The circuit of claim 9 wherein the phase comparing element further comprises a first delay element coupled to receive the clock signal and a second delay element coupled to receive the delayed clock signal.

12. The circuit of claim 11 wherein the delay circuit comprises a first inverting half delay-circuit coupled to a second inverting half-delay circuit.

13. The circuit of claim 12 wherein the first and second inverting half-delay circuits are coupled to a multiplexor providing an output of the delay circuit and wherein the delayed clock signal has a delay of an average half-period.

14. The circuit of claim 12 further comprising an inverter coupled to receive the clock signal before the clock signal is received by the delay circuit and the phase comparing element.

15. A circuit comprising:
   a clock signal generator; and
   a phase comparing element coupled to the clock signal generator to receive a first clock signal and a second clock signal derived from the first clock signal, the phase comparing element to measure a phase difference between the first clock signal and the second clock signal.

16. The circuit of claim 15 further comprising a delay circuit coupled to the clock signal generator and the phase comparing element.

17. The circuit of claim 16 wherein the first clock signal comprises an instantaneous clock signal and the second clock signal comprises a clock signal delayed by an average duration provided by the delay circuit.

18. The circuit of claim 15 further comprising a half-delay circuit coupled to the phase comparing element.

19. The circuit of claim 18 wherein the first clock signal comprises an instantaneous low phase and the second clock signal comprises a clock signal delayed an average half-period provided by the half-delay circuit.

20. The circuit of claim 15 further comprising a half-delay circuit coupled to the phase comparing element and an inverter coupled to the clock signal generator, the phase comparing element and the half-delay circuit.

21. The circuit of claim 20 wherein the first clock signal comprises an instantaneous high phase and the second clock signal comprises a clock signal delayed an average half-period provided by the half-delay circuit.

22. A method for detecting error in a clock signal, the method comprising the steps of:
   delaying a clock signal by an average duration to provide a delayed clock signal; and
   comparing the delayed clock signal with an instantaneous clock signal, wherein the delayed clock signal is derived from the instantaneous clock signal.

23. The method of claim 22 wherein the comparing step comprises the steps of:
further delaying the delayed clock signal;
comparing the further delayed clock signal to the instantaneous clock signal;
delaying the instantaneous clock signal; and
comparing the delayed instantaneous clock signal to the delayed clock signal.

24. The method of claim 22 further comprising the step of measuring a phase difference between the delayed clock signal and the instantaneous clock signal.

25. The method of claim 22 wherein the delayed clock signal has a delay of an average period.

26. The method of claim 22 wherein the delayed clock signal has a delay of an average half-period.

27. A method comprising the steps of:
generating a reference clock signal; and
comparing the reference clock signal with an instantaneous clock signal, wherein the reference clock signal is derived from the instantaneous clock signal.

28. The method of claim 27 further comprising the step of measuring a phase difference between the reference clock signal and the instantaneous clock signal.

29. The method of claim 27 wherein the comparing step comprises the steps of:
delaying the reference clock signal;
comparing the delayed reference clock signal to the instantaneous clock signal;
delaying the instantaneous clock signal; and
comparing the delayed instantaneous clock signal to the reference clock signal.

30. The method of claim 27 wherein the reference clock signal comprises the instantaneous clock signal delayed for an average duration.

* * * * *

UNITED STATES PATENT AND TRADEMARK OFFICE
CERTIFICATE OF CORRECTION

PATENT NO. : 6,208,169 B1
DATED : March 27, 2001
INVENTOR(S) : Wong et al.

It is certified that error appears in the above-identified patent and that said Letters Patent is hereby corrected as shown below:

Column 4,
Line 35, delete "bins provide" and insert -- Fine bins provide --.
Line 39, delete "once" and insert -- Once --.

Signed and Sealed this

Twenty-first Day of May, 2002

*Attest:*

*Attesting Officer*

JAMES E. ROGAN
*Director of the United States Patent and Trademark Office*